(12) United States Patent
Chung et al.

(10) Patent No.: US 7,432,162 B2
(45) Date of Patent: Oct. 7, 2008

(54) SEMICONDUCTOR DEVICE WITH SUBSTANTIAL DRIVING CURRENT AND DECREASED JUNCTION LEAKAGE CURRENT

(75) Inventors: Sung Woong Chung, Gyeonggi-do (KR); Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/480,866

(22) Filed: Jul. 6, 2006

(65) Prior Publication Data

US 2007/0246774 A1    Oct. 25, 2007

(30) Foreign Application Priority Data

Mar. 23, 2006    (KR) .................. 10-2006-0026512

(51) Int. Cl.
    *H01L 21/336*    (2006.01)
(52) U.S. Cl. ................ 438/270; 438/589; 257/E21.629
(58) Field of Classification Search ................ 438/589; 257/E21.629
    See application file for complete search history.

(56) References Cited

U.S. PATENT DOCUMENTS

| 6,190,971 | B1 * | 2/2001 | Gruening et al. | 438/270 |
| 6,239,465 | B1 * | 5/2001 | Nakagawa | 257/331 |
| 6,855,604 | B2 * | 2/2005 | Lee | 438/270 |
| 7,122,425 | B2 * | 10/2006 | Chance et al. | 438/253 |
| 7,153,745 | B2 | 12/2006 | Cho | 438/270 |
| 7,285,466 | B2 * | 10/2007 | Kim et al. | 438/270 |
| 2005/0233513 | A1 * | 10/2005 | Kim et al. | 438/197 |

\* cited by examiner

*Primary Examiner*—Stephen W Smoot
(74) *Attorney, Agent, or Firm*—Townsend and Townsend and Crew LLP

(57) ABSTRACT

The semiconductor device includes an active region, a stepped recess channel region including vertical channel structures, a gate insulating film, and a gate structure. The active region is defined by a device isolation structure formed in a semiconductor substrate. The stepped recess channel region is formed in the active region. The vertical silicon-on-insulator (SOI) channel structures are disposed at sidewalls of both device isolation structures in a longitudinal direction of a gate region. The gate insulating film is disposed over the active region including the stepped recess channel region. The gate structure is disposed over the stepped recess channel region of the gate region.

25 Claims, 12 Drawing Sheets

<Prior Art>

SEMICONDUCTOR DEVICE WITH SUBSTANTIAL DRIVING CURRENT AND DECREASED JUNCTION LEAKAGE CURRENT

CROSS-REFERENCES TO RELATED APPLICATIONS

The present application claims priority to Korean patent application number 10-2006-0026512, filed on Mar. 23, 2006, which is incorporated by reference in its entirety.

BACKGROUND OF THE INVENTION

The present invention relates to a memory device. More particularly, the present invention relates to a semiconductor device and a method for fabricating the same having a stepped recess channel region including vertical silicon-on-insulator (SOI) channel structures.

When a channel length of a cell transistor is decreased, the ion concentration of a cell channel region is generally increased in order to maintain the threshold voltage of the cell transistor. An electric field in source/drain regions of the cell transistor is enhanced to increase leakage current. This results in degradation of the refresh characteristics of a dynamic random access memory (DRAM) structure. Therefore, there is a need for semiconductor devices in which the refresh characteristics are improved.

FIG. 1 is a simplified layout of a semiconductor device, wherein reference numerals 1 and 3 denote an active region, which is defined by a device isolation structure 30, and a gate region, respectively.

FIGS. 2a through 2c are simplified cross-sectional views illustrating a method for fabricating a semiconductor device, wherein FIGS. 2a through 2c are cross-sectional views taken along the line I-I' of FIG. 1.

Referring to FIG. 2a, a semiconductor substrate 10 having a pad insulating film (not shown) is etched using a device isolation mask (not shown) to form a trench (not shown) defining a Fin-type active region 20. An insulating film for device isolation (not shown) is formed to fill the trench. The insulating film for device isolation is polished until the pad insulating film is exposed to form a device isolation structure 30. The pad insulating film is removed to expose the top surface of the Fin-type active region 20.

Referring to FIG. 2b, a predetermined thickness of the device isolation structure 30 is etched using a recess gate mask (not shown) defining a gate region 3 shown in FIG. 1 to protrude an upper part of the Fin-type active region 20 over the device isolation structure 30.

Referring to FIG. 2c, a gate insulating film 60 is formed over the protruded Fin-type active region 20. A gate structure 90 is formed over the gate insulating film 60 of the gate region 3 shown in FIG. 1 to fill the protruded Fin-type active region 20, wherein the gate structure 90 comprises a stacked structure of a gate electrode 70 and a gate hard mask layer pattern 80.

FIG. 3 is a simplified cross-sectional view illustrating a semiconductor device. Referring to FIG. 3, if a voltage above the threshold voltage is applied to the gate, an inversion layer IL and a depletion region DR are formed in a semiconductor substrate 10 under the gate insulating film 60.

According to the above method for fabricating a semiconductor device, it is difficult to secure On/Off characteristics of the cell transistor due to shrinkage of its channel length. Since the channel area of the device is limited, it is also difficult to obtain substantial driving current. Even through the Fin FET structure of the cell transistor (trigate) has been proposed in order to secure the channel area of the device, there are problems of lowering its threshold voltage, degrading its refresh characteristics, and increasing the degree of process complexity such as the process of etching the device isolation structure.

BRIEF SUMMARY OF THE INVENTION

The present invention relates to a semiconductor device and a method for fabricating the same wherein a stepped recess channel region including vertical silicon-on-insulator (SOI) channel structures, which are disposed at sidewalls of both device isolation structures under a gate in a longitudinal direction of a gate region, is formed, thereby securing substantial driving current and decreasing its junction leakage current. Accordingly, the short channel effect (SCE) and refresh characteristics of the device can be improved.

According to an embodiment of the present invention, a semiconductor device includes: a device isolation structure formed in a semiconductor substrate to define an active region; a stepped recess channel region including vertical silicon-on-insulator (SOI) channel structures formed in the active region, wherein the vertical SOI channel structures are disposed at sidewalls of both device isolation structures in a longitudinal direction of a gate region; and a gate structure disposed over the stepped recess channel region of the gate region.

According to another embodiment of the present invention, a method for fabricating a semiconductor device includes: (a) forming a device isolation structure in a semiconductor substrate having a pad insulating film; (b) selectively etching the pad insulating film by a recess gate mask to expose the semiconductor substrate of a recess region; (c) forming a spacer at a sidewall of the recess region; (d) etching a predetermined thickness of the semiconductor substrate exposed at the lower part of the recess region using the spacer as an etching mask to form a first recess; (e) removing the spacer to expose its underlying semiconductor substrate; (f) etching a predetermined thickness of the exposed semiconductor substrate to form a second recess, wherein a stepped recess channel region including vertical silicon-on-insulator (SOI) channel structures is formed at the lower part of the second recess, wherein the vertical SOI channel structures are formed at sidewalls of both device isolation structures in the longitudinal direction of a gate region; (g) removing the pad insulating film to expose the semiconductor substrate including the stepped recess channel region; (h) forming a gate insulating film over the exposed semiconductor substrate; and (i) forming a gate structure over the gate insulating film of the gate region, wherein the gate structure includes a stacked structure of a gate electrode filling the recess channel region and a gate hard mask layer pattern.

BRIEF DESCRIPTION OF THE DRAWINGS

FIGS. 5(i), 5(ii), and 7 are simplified cross-sectional views illustrating a semiconductor device according to an embodiment of the present invention.

DESCRIPTION OF SPECIFIC EMBODIMENTS

The present invention relates to a semiconductor device and a method for fabricating the same wherein a stepped recess channel region including vertical silicon-on-insulator (SOI) channel structures, which are disposed at sidewalls of both device isolation structures under a gate in a longitudinal direction of a gate region, is formed, thereby securing substantial driving current and decreasing its junction leakage current. Accordingly, the short channel effect (SCE) and refresh characteristics of the device can be improved.

Figure 1:
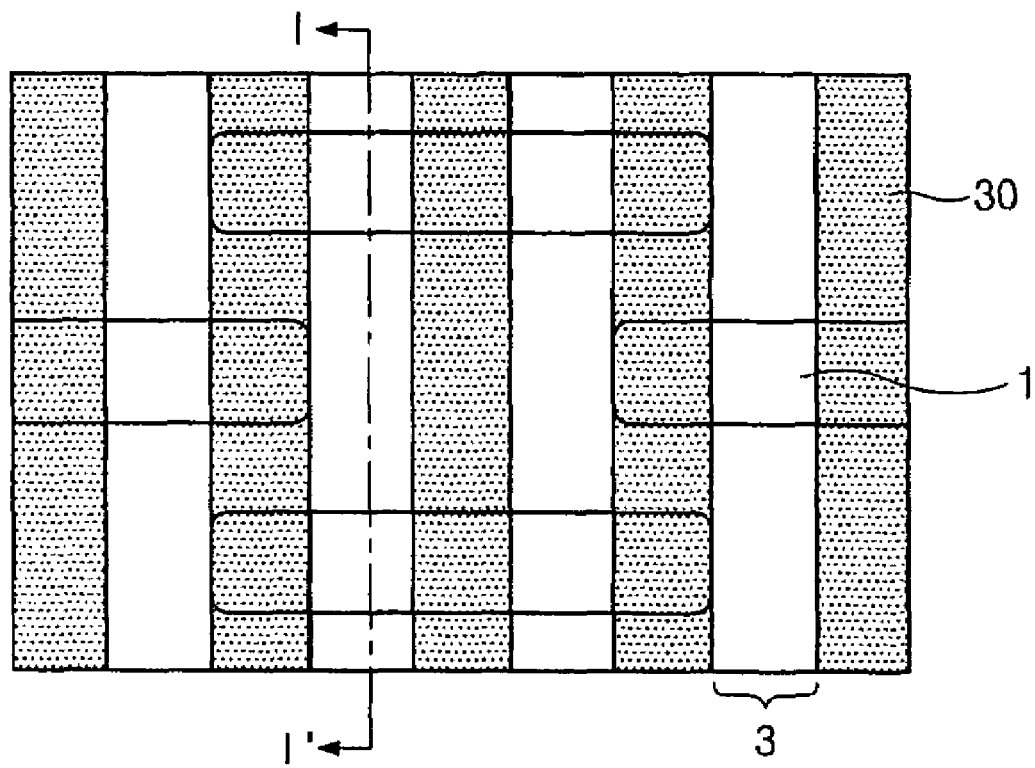
FIG. 1 is a simplified layout of a semiconductor device.
Figure 2A:
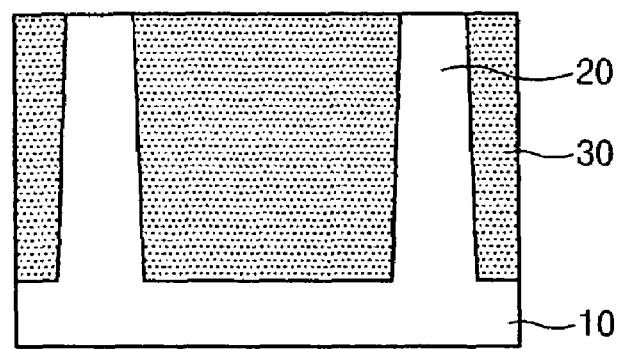
FIGS. 2a through 2c are simplified cross-sectional views illustrating a method for fabricating a semiconductor device.
Figure 2B:
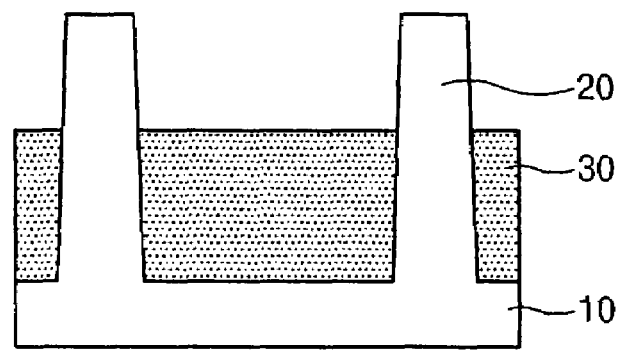
Figure 2C:
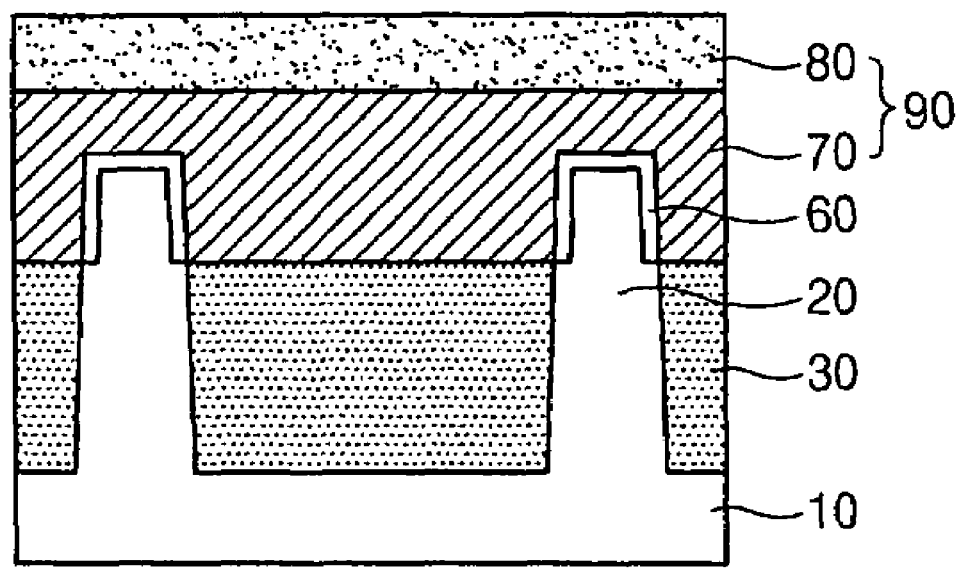
Figure 3:
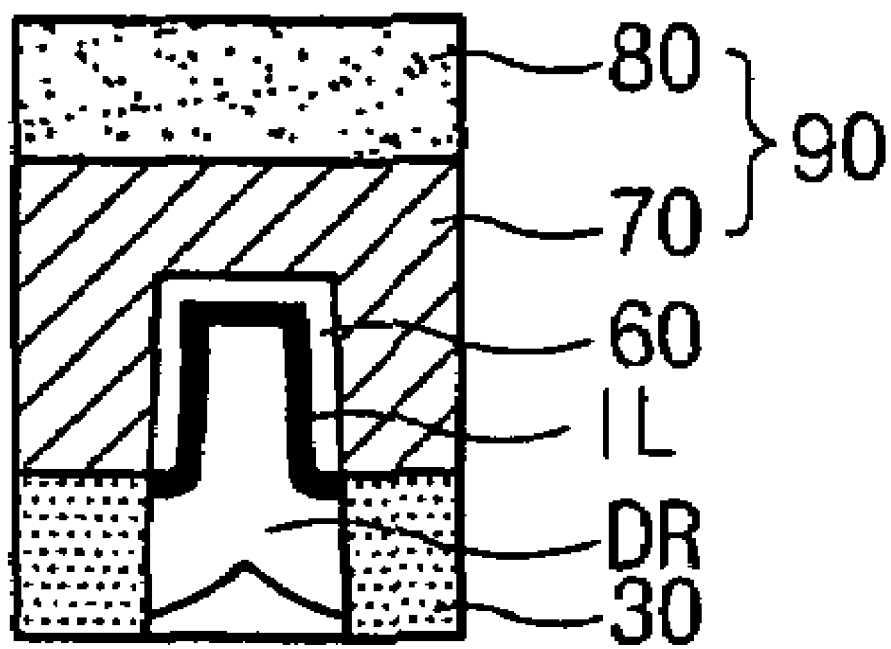
FIG. 3 is a simplified cross-sectional view illustrating a semiconductor device.
Figure 4:
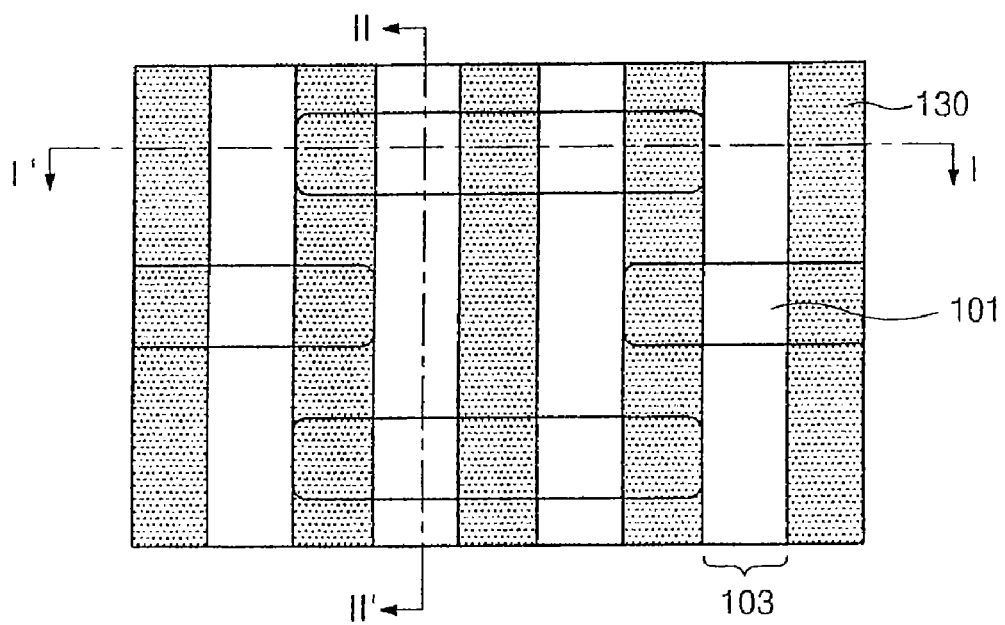
FIG. 4 is a simplified layout of a semiconductor device according to an embodiment of the present invention.

FIG. 4 is a simplified layout of a semiconductor device according to an embodiment of the present invention, wherein reference numerals 101 and 103 denote an active region defined by the device isolation structure 130 and a gate region, respectively.

Figure 5:
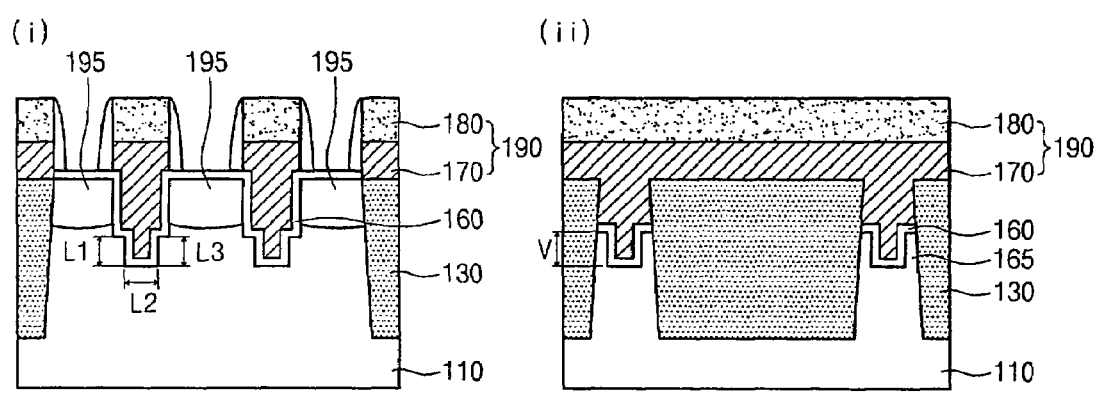

FIGS. 5(i) and 5(ii) are simplified cross-sectional views of a semiconductor device according to an embodiment of the present invention, wherein FIG. 5(i) is a cross-sectional view taken along a longitudinal direction in accordance with the line I-I' of FIG. 4 and FIG. 5(ii) is a cross-sectional view taken along a latitudinal direction in accordance with the line II-II' of FIG. 4.

Referring to FIGS. 5(i) and 5(ii), a device isolation structure 130 defining the active region 101 shown in FIG. 4 is formed in a semiconductor substrate 110. A stepped recess channel region (L1+L2+L3) is formed in the active region 101 shown in FIG. 4. In one embodiment of the present invention, the stepped recess channel region (L1+L2+L3) includes vertical silicon-on-insulator (SOI) channel structures 165, which are disposed at sidewalls of both device isolation structures 130 in a longitudinal direction of a gate region 103 shown in FIG. 4. In addition, the stepped recess channel region (L1+L2+L3) includes vertical channel regions L1 and L3 and a horizontal channel region L2 in a longitudinal direction of the active region 101 of FIG. 4. In another embodiment, a thickness of the vertical SOI channel structure 165 in a longitudinal direction of the gate region 103 shown in FIG. 4 ranges from about 1 nm to about 50 nm in a horizontal direction. In addition, a depth of the vertical SOI channel structure 165 from the upper step of the stepped recess channel region to its lower step ranges from about 5 nm to about 200 nm in a vertical direction.

In addition, a gate insulating film 160 is disposed over the active region 101 of FIG. 4 including the stepped recess channel region. A gate structure 190 corresponding the gate region 103 (FIG. 4) is disposed over the gate insulating film 160. Spacers (not shown) are formed at both sidewalls of the gate structure 190. Source/drain regions 195 are formed in the semiconductor substrate 110 between the gate structures 190. In one embodiment of the present invention, the gate structure 190 includes a stacked structure of a gate electrode 170 filling the stepped recess channel region and a gate hard mask layer pattern 180. The gate electrode 170 includes a stacked structure of a lower gate electrode (not shown) and an upper gate electrode (not shown). In another embodiment of the present invention, the lower gate electrode is a polysilicon layer doped with impurity ions such as P or B. The upper gate electrode is selected from the group consisting of a titanium (Ti) layer, a titanium nitride (TiN) film, a tungsten (W) layer, an aluminum (Al) layer, a copper (Cu) layer, a tungsten silicide ($WSi_x$) layer or combinations thereof.

Figure 7:
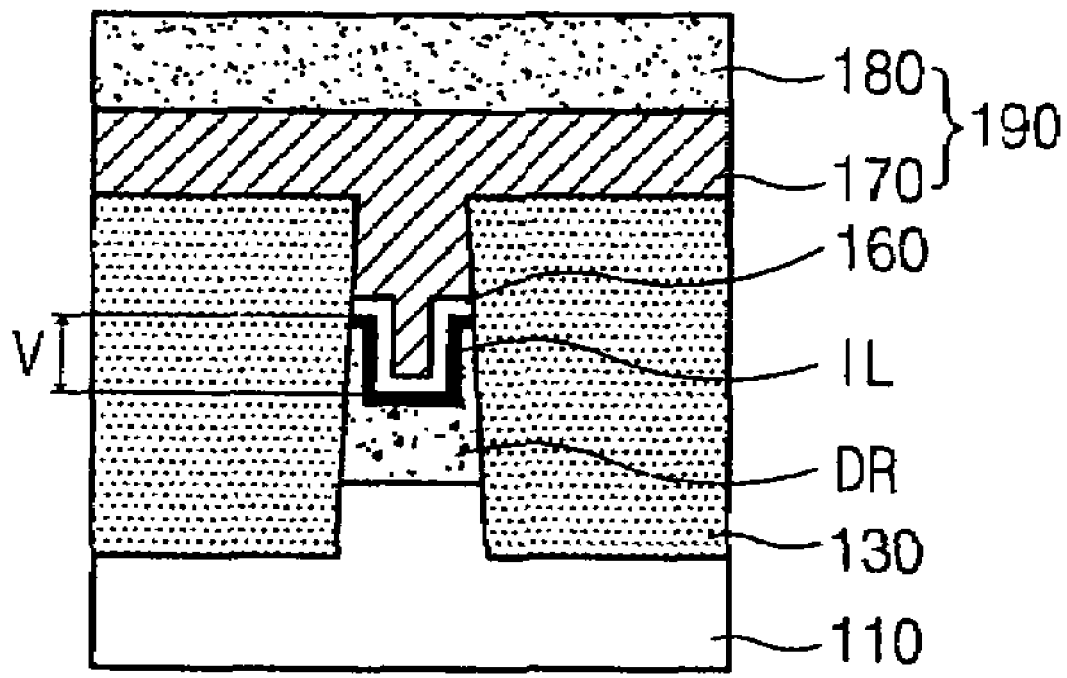

FIG. 7 is a simplified cross-sectional view illustrating a semiconductor device according to the present invention, which shows in detail the stepped recess channel region under the gate structure 190.

Referring to FIG. 7, the stepped recess channel region includes vertical SOI channel structures disposed at sidewalls of both device isolation structures 130 in a longitudinal direction of the gate region 103 shown in FIG. 4. When voltage above the threshold voltage is applied to a gate, an inversion layer IL and a depletion region DR are formed in the stepped recess channel region including the vertical SOI channel structures. As a result, the lowering of threshold voltage due to decreased number of charges in the depletion region can be overcome by the stepped recess channel region. Since a contact area between the stepped channel region and the source/drain regions 195 is decreased due to shrinkage of channel thickness, leakage current of the source/drain regions 195 can be reduced. Accordingly, refresh characteristics of the device can be improved. In addition, a complete depletion region is formed because of the thin vertical SOI channel structures, which results in improving the short channel effect (SCE) of the device.

Accordingly, it can be realized with improvement of the short channel effect (SCE) of the device, increase in its driving current, and minimizing its leakage current.

Figure 6A:
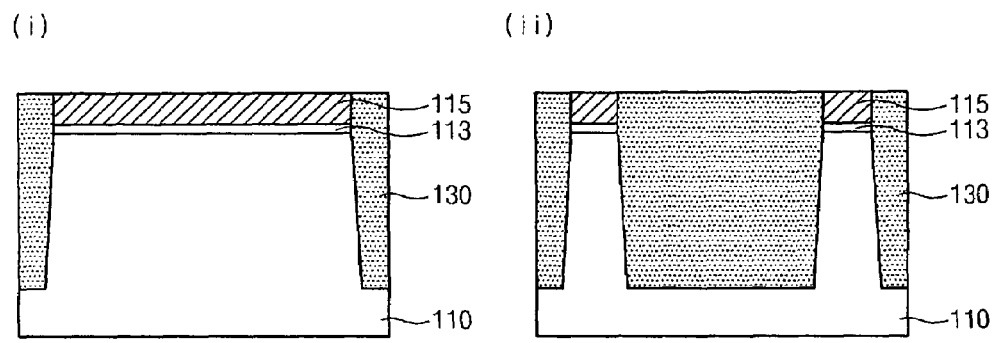
FIGS. 6a through 6j are simplified cross-sectional views illustrating a method for fabricating a semiconductor device according to an embodiment of the present invention.

FIGS. 6a through 6j are simplified cross-sectional views illustrating a method for fabricating a semiconductor device according to an embodiment of the present invention, wherein FIGS. 6a(i) through 6j(i) are cross-sectional views taken along a longitudinal direction in accordance with the line I-I' of FIG. 4 and FIGS. 6a(ii) through 6j(ii) are cross-sectional views taken along a latitudinal direction in accordance with the line II-II' of FIG. 4.

Referring to FIG. 6a, a pad oxide film 113 and a pad nitride film 115 are formed over a semiconductor substrate 110. The pad nitride film 115, the pad oxide film 113, and the semiconductor substrate 110 are etched using a device isolation mask (not shown) as an etching mask to form a trench (not shown) defining an active region. An insulating film for device isolation (not shown) is formed over an entire surface of the resulting structure to fill up the trench. The insulating film for device isolation is polished until the pad nitride film 115 is exposed to form a device isolation structure 130. In one embodiment of the present invention, the insulating film for device isolation is a silicon oxide film. In addition, a polishing process for the device isolation structure 130 is performed by a chemical mechanical polishing (CMP) method.

Figure 6B:
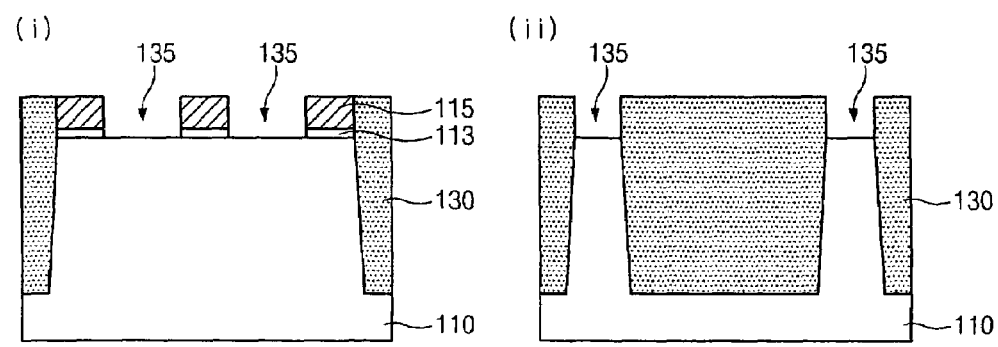
Figure 6C:
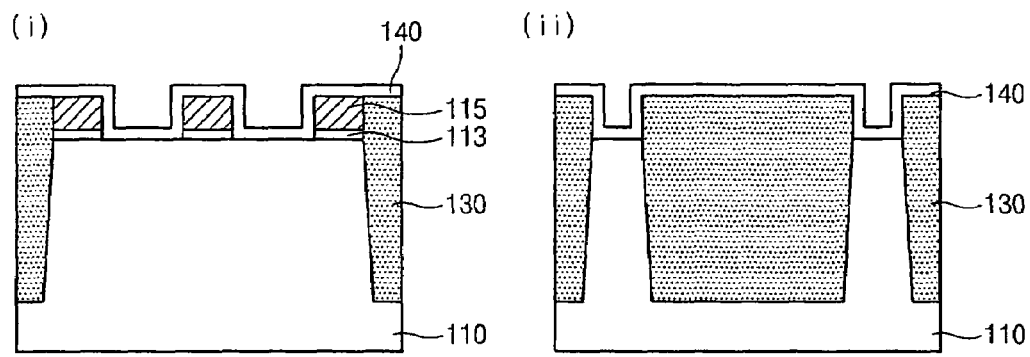
Figure 6D:
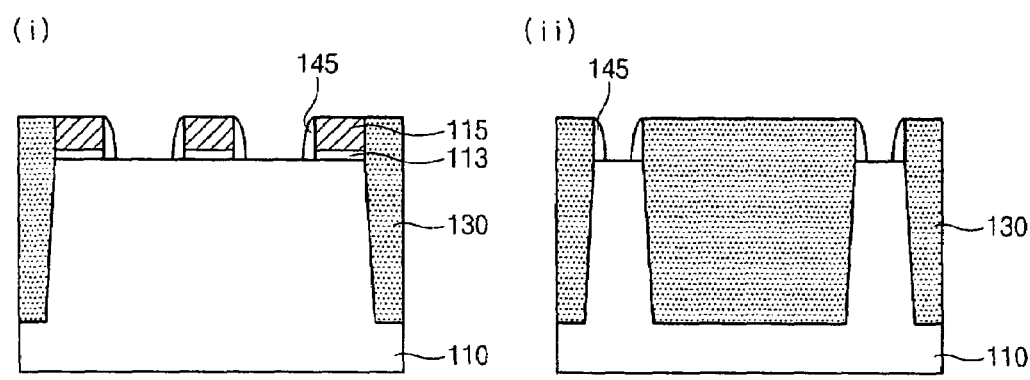

Referring to FIGS. 6b through 6d, the pad nitride film 115 and the pad oxide film 113 are etched using a recess gate mask (not shown) defining a gate region 103 shown in FIG. 4 as an etching mask to expose the semiconductor substrate 110 of a recess region 135. An insulating film 140 is formed over an entire surface of the resulting structure. The insulating film 140 is etched to form a spacer 145 on a sidewall of the recess region 135. In one embodiment of the present invention, the insulating film 140 is selected from the group consisting of a silicon nitride film, a silicon oxide film, a polysilicon layer or combinations thereof with its thickness ranging from about 1 nm to about 50 nm. In addition, a process for forming the insulating film 140 is performed by a chemical vapor deposition (CVD) method using a source gas including $SiH_4$, $O_2$, $N_2O$, $Si(OC_2H_5)_4$, $SiH_2Cl_2$, $NH_3$, $N_2$, He or combinations thereof. Further, the etching process for the spacer 145 is performed by a plasma etching method using a gas including $C_xF_yH_z$, $O_2$, HCl, Ar, He or combinations thereof.

Figure 6E:
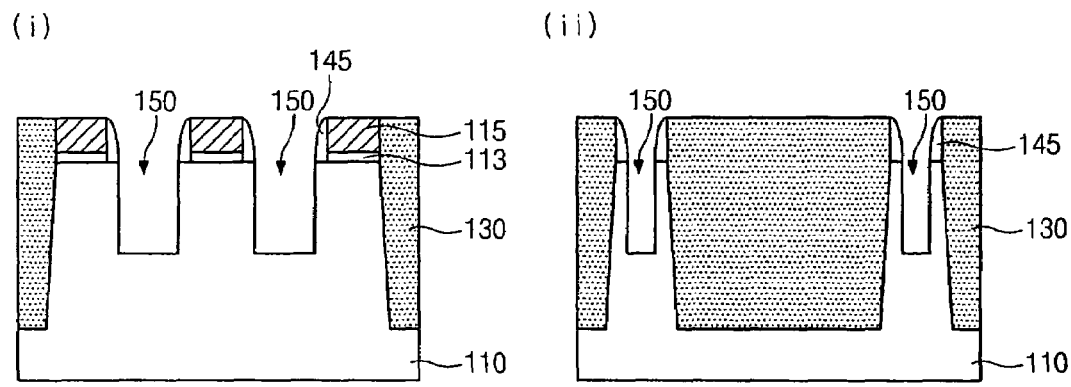
Figure 6F:
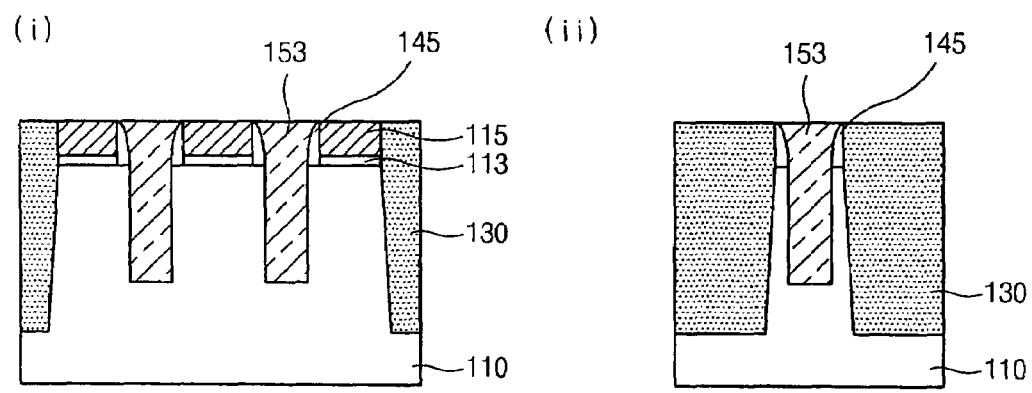

Referring to FIGS. 6e and 6f, the semiconductor substrate 110 exposed at the lower part of the recess region 135 is etched using the spacer 145 as an etching mask to form a first recess 150. A buffer film 153 is formed an entire surface of the resulting structure to fill up the first recess 150. In one embodiment of the present invention, a depth of the etched semiconductor substrate 110 ranges from about 10 nm to about 500 nm. In addition, the buffer film 153 is formed of a predetermined material, which has etching selectivity greater than that of a silicon oxide film or a silicon nitride film. The predetermined material for the buffer film 153 is selected from the group consisting of a Spin-on glass (SOG) film, a borosilicate glass (BSG) film, a phosphosilicate glass (PSG) film, a borophosphosilicate glass (BPSG) film, or combinations thereof.

Figure 6G:
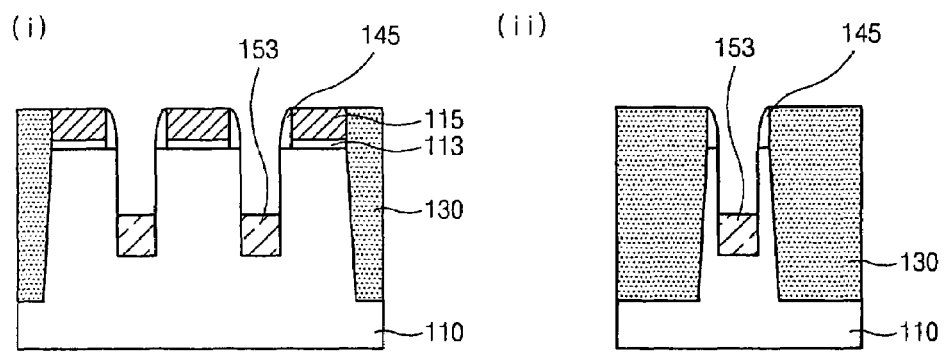
Figure 6H:
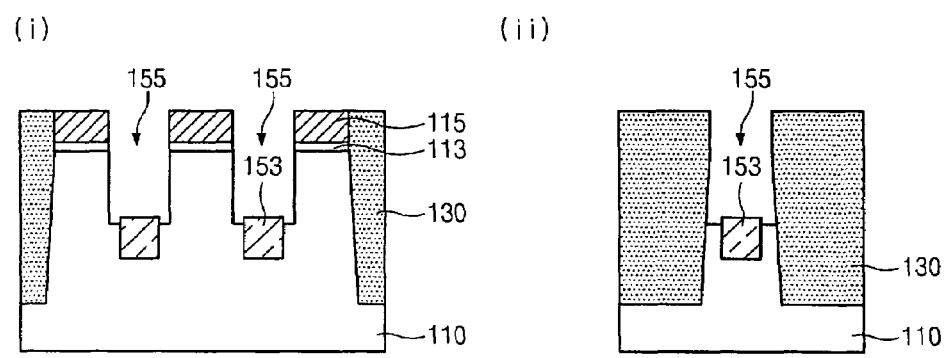
Figure 6I:
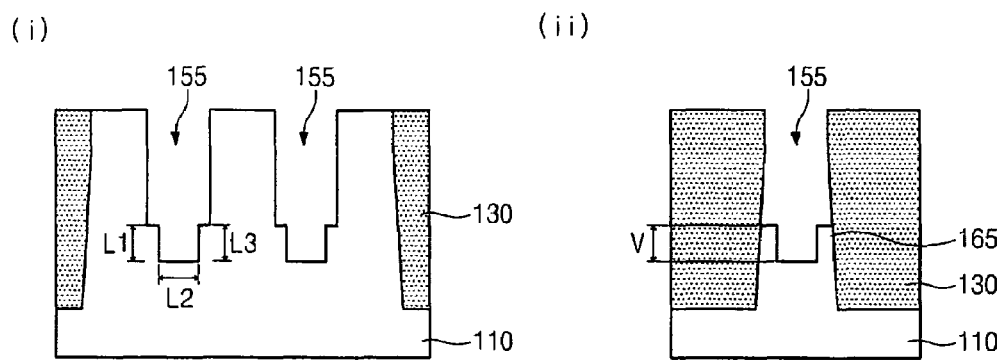

Referring to FIGS. 6g through 6i, the buffer film 153 is selectively etched so that a predetermined thickness of the buffer film 153 remains at the lower part of the first recess 150. The spacer 145 is removed to expose the semiconductor substrate 110 between the pad nitride film 115 and the remaining buffer film 153. A predetermined thickness of the exposed semiconductor substrate 110 is etched to form a second recess 155. The remaining buffer film 153 is removed to form a stepped recess channel region (L1+L2+L3). The pad nitride film 115 and the pad oxide film 113 are removed to expose the semiconductor substrate 110 including the stepped recess channel region (L1+L2+L3). In one embodiment of the present invention, the stepped recess channel region (L1+L2+L3) includes vertical silicon-on-insulator (SOI) channel structures 165, which are formed at sidewalls of both device isolation structures 130 in a longitudinal direction of the gate region 103 shown in FIG. 4. In addition, the etching process for the buffer film 153 is performed using a solution including HF. In another embodiment, the etching process for the second recess 155 is performed by i) a plasma etching method using a gas including $F_2$ or $Cl_2$, ii) a dry etching method using a gas including HCl, iii) a wet etching method using a solution including $NH_4OH$ or KOH, or iv) combinations thereof. In addition, a depth of the etched semiconductor substrate 110 ranges from about 10 nm to about 500 nm during the process of forming the second recess 155. A depth of the vertical SOI channel structure V from the upper step of the stepped recess channel region to its lower step ranges from about 5 nm to about 200 nm in a vertical direction.

According to another embodiment of the present invention, the buffer film 153 is etched until the pad nitride film 115 is exposed. The spacer 145 between the buffer film 153 and the pad nitride film 115 is selectively removed to expose its underlying semiconductor substrate 110. The exposed semiconductor substrate 110 and the buffer film 153 are simultaneously etched to form a second recess 155. Next, the remaining buffer film 153 at the lower part of the second recess 155 is selectively removed to form a stepped recess channel region (L1+L2+L3). At this time, the stepped recess channel region includes vertical silicon-on-insulator (SOI) channel structures 165, which are formed at sidewalls of both device isolation structures 130 in a longitudinal direction of the gate region 103 shown in FIG. 4. Thereafter, the pad nitride film 115 and the pad oxide film 113 are removed to expose the semiconductor substrate 110 including the stepped recess channel region (L1+L2+L3).

Accordingly, a semiconductor device having the stepped recess channel region, which is combined with vertical SOI channel and recess channel structures; is designed in accordance with one embodiment of the present invention, thereby securing substantial driving current and decreasing junction leakage current of the device. As a result, the short channel effect (SCE) and refresh characteristics of the device can be improved.

Figure 6J:
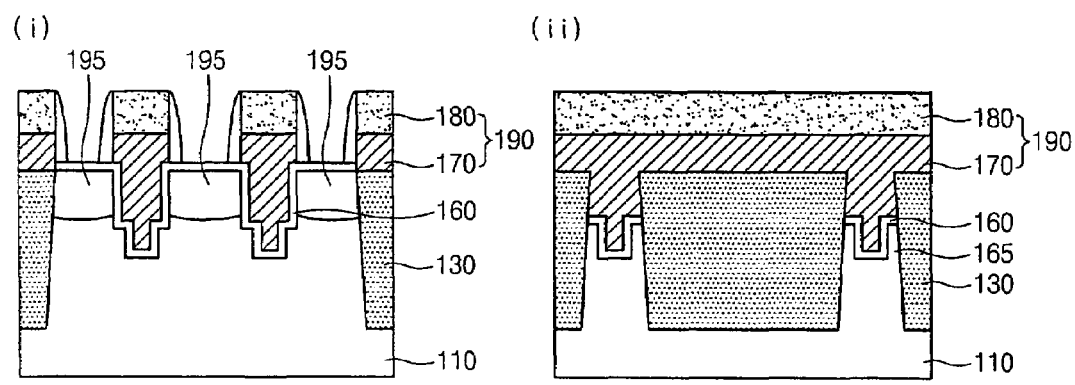

Referring to FIG. 6j, a gate insulating film 160 is formed over the exposed semiconductor substrate 110. A lower gate conductive layer (not shown) is formed over an entire surface of the resulting structure to fill up the second recess 155. An upper gate conductive layer (not shown) and a gate hard mask layer (not shown) are formed over the lower gate conductive layer. The gate hard mask layer, the upper gate conductive layer, and the lower gate conductive layer are patterned using a gate mask (not shown) as an etching mask to form a gate structure 190 comprising a stacked structure of a gate electrode 170 and a gate hard mask layer pattern 180. Gate spacers (not shown) are formed on sidewalls of the gate structure 190. Impurity ions are injected into the semiconductor substrate 110 at both sides of the gate structure 190 including the gate spacer to form source/drain regions 195. In one embodiment, a process for cleaning the exposed semiconductor substrate 110 can be performed by a solution including HF before the formation of the gate insulating film 160. In addition, the gate insulating film 160 is formed using a gas including $O_2$, $H_2O$, $O_3$ or combinations thereof with its thickness ranging from about 1 nm to about 10 nm. In another embodiment, the lower gate conductive layer is formed of a polysilicon layer doped with impurity ions such as P or B. Here, the doped polysilicon layer is formed by implanting impurity ions into an undoped polysilicon or by using a silicon source gas and an impurity source gas including P or B. In addition, the upper gate conductive layer is selected from the group consisting of a titanium (Ti) layer, a titanium nitride (TiN) film, a tungsten (W) layer, an aluminum (Al) layer, a copper (Cu) layer, a tungsten silicide ($WSi_x$) layer or combinations thereof.

In addition, subsequent processes such as a process for forming a landing plug, a process for forming a bit line contact and a bit line, a process for forming a capacitor, and a process for forming an interconnect may be performed.

As described above, the semiconductor substrate and method for fabricating the same in accordance with an embodiment of the present invention provides forming a stepped recess channel region including vertical SOI channel structures on sidewalls of both device isolation structures under a gate structure, thereby obtaining relatively large driving current. In addition, the lowering of threshold voltage due to drain voltage, body effect, and gate On/Off characteristics can be improved because of SOI structure. According to the present invention, the semiconductor substrate has extendibility capable of securing substantial channel area of the device despite shrinkage of its design rules. The conventional gate mask may be used for forming the recess region. As a result, the process cost can be saved. The process is made simple, which results in decreasing the number of defected devices.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method for fabricating a semiconductor device comprising:
   (a) forming device isolation structures in a semiconductor substrate having a pad insulating film;
   (b) selectively etching the pad insulating film by a recess gate mask to expose the semiconductor substrate of a recess region;
   (c) forming spacer at a sidewall of the recess region;
   (d) etching a predetermined thickness of the semiconductor substrate exposed at the lower part of the recess region using the spacer as an etching mask to form a first recess;
   (e) removing the spacer to expose its underlying semiconductor substrate;
   (f) etching a predetermined thickness of the semiconductor substrate exposed at the step (e) to form a second recess, wherein a stepped recess channel region including vertical silicon-on-insulator (SOI) channel structures is formed at the lower part of the second recess, wherein the vertical SOI channel structures are formed at sidewalls of the device isolation structures in a longitudinal direction of a gate region;
   (g) removing the pad insulating film to expose the semiconductor substrate including the stepped recess channel region;
   (h) forming a gate insulating film over the semiconductor substrate exposed at the step (g); and
   (i) forming a gate structure over the gate insulating film of the gate region, wherein the gate structure includes a stacked structure of a gate electrode filling the stepped recess channel region and a gate hard mask layer pattern.

2. The method according to claim 1, wherein the pad insulating film is selected from the group consisting of a silicon nitride film, a silicon oxide film, a polysilicon layer and combinations thereof.

3. The method according to claim 1, wherein step (a) includes:
   (a-1) etching the pad insulating film and the semiconductor substrate using a device isolation mask as an etching mask to form a trench defining an active region;
   (a-2) forming an insulating film for device isolation over an entire surface of the active region to fill up the trench;
   (a-3) polishing the insulating film until either a pad nitride film or a pad silicon oxide film is exposed to form the device isolation structure.

4. The method according to claim 3, wherein the pad insulating film is selected from the group consisting of a silicon nitride film, a silicon oxide film, a polysilicon layer and combinations thereof.

5. The method according to claim 4, wherein the pad insulating film has a thickness ranging from about 1 nm to about 50 nm.

6. The method according to claim 4, wherein polishing the insulating film to form the device isolation structures is performed by a CMP method.

7. The method according to claim 1, wherein step (c) includes:
   (c-1) forming an insulating film over an entire surface of the resulting structure; and
   (c-2) etching the insulating film to form the spacer at a sidewall of the recess region.

8. The method according to claim 7, wherein the insulating film is selected from the group consisting of a silicon nitride film, a silicon oxide film, a polysilicon layer and combinations thereof.

9. The method according to claim 8, wherein the insulating film has a thickness ranging from about 1 nm to about 50 nm.

10. The method according to claim 8, wherein the insulating film is formed by a CVD method using a source gas selected from the group consisting of $SiH_4$, $O_2$, $N_2O$, $Si(OC_2H_5)_4$, $SiH_2Cl_2$, $NH_3$, $N_2$, He, and combinations thereof.

11. The method according to claim 7, wherein the etching process for the insulating film is performed by a plasma etching method using a gas selected from the group consisting of $C_xF_yH_z$, $O_2$ HCl, Ar, He, and combinations thereof.

12. The method according to claim 1, wherein a thickness of the etched semiconductor substrate ranges from about 10 nm to about 500 nm during the etching process for the first recess.

13. The method according to claim 1, wherein step (e) includes:
   (e-1) forming a buffer film filling the first recess;
   (e-2) removing the spacer to expose the semiconductor substrate between the pad insulating film and the buffer film;
   (e-3) etching a predetermined thickness of the semiconductor substrate exposed at the step (e-2) to form a second recess; and
   (e-4) selectively removing the buffer film to form a stepped recess channel region at the lower part of the second recess, wherein the stepped recess channel region includes vertical silicon-on-insulator (SOI) channel structures which are formed at sidewalls of the device isolation structures in the longitudinal direction of a gate region.

14. The method according to claim 13, wherein the buffer film is formed of a film selected from the group consisting of a Spin-on glass (SOG) film, a boronsilicate glass (BSG) film, a phosphosilicate glass (PSG) film, a borophosphosilicate glass (BPSG) film and combinations thereof.

15. The method according to claim 13, wherein a thickness of the etched semiconductor substrate ranges from about 20 nm to about 500 nm during the etching process for the second recess.

16. The method according to claim 13, wherein the buffer film is simultaneously removed during the etching process for the second recess.

17. The method according to claim 13, wherein the etching process for the second recess is performed by i) a plasma etching method using a gas including $F_2$ or $Cl_2$, ii) a dry etching method using a gas including HCl, iii) a wet etching method using a solution including $NH_4OH$ or KOH, or iv) combinations thereof.

18. The method according to claim 13, wherein the process of removing the buffer film is performed by a solution including HF.

19. The method according to claim 1, wherein a depth of the vertical SOI channel structures from an upper step of the stepped recess channel region to a corresponding lower step ranges from 5 nm to 200 nm in a vertical direction.

20. The method according to claim 1, further comprising cleaning the exposed semiconductor substrate using a solution including HF.

21. The method according to claim 1, wherein the gate insulating film is formed using a gas selected from the group consisting of $O_2$, $H_2O$, $O_3$, and combinations thereof with its thickness ranging from about 1 nm to about 10 nm.

22. The method according to claim 1, wherein step (h) includes
   (h-1) forming a lower gate conductive layer over an entire surface of the resulting structure to fill the second recess;

(h-2) forming an upper gate conductive layer and a gate hard mask layer over the lower gate conductive layer; and (h-3) patterning the gate hard mask layer, the upper gate conductive layer, and the lower gate conductive layer by a gate mask to form a gate structure, wherein the gate structure comprises the stacked structure of a gate electrode and a gate hard mask layer pattern.

23. The method according to claim 22, wherein the lower gate conductive layer is formed of a polysilicon layer doped with impurity ions.

24. The method according to claim 23, wherein the impurity ions include P or B.

25. The method according to claim 22, wherein the upper gate conductive layer is selected from the group consisting of a titanium layer, a titanium nitride layer, a tungsten layer, an aluminum layer, a copper layer, a tungsten silicide layer and combinations thereof.

* * * * *